US011195648B2

(12) United States Patent
Fukuchi et al.

(10) Patent No.: US 11,195,648 B2
(45) Date of Patent: Dec. 7, 2021

(54) ELECTRONIC APPLIANCE AND POWER CONVERSION APPARATUS

(71) Applicant: FUJI ELECTRIC CO., LTD., Kawasaki (JP)

(72) Inventors: Shun Fukuchi, Suzuka (JP); Masakazu Gekinozu, Matsumoto (JP); Takanori Shintani, Suzuka (JP); Masahiro Tatsukawa, Gyoda (JP); Masaki Sakuma, Hino (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 963 days.

(21) Appl. No.: 15/899,663

(22) Filed: Feb. 20, 2018

(65) Prior Publication Data

US 2018/0174731 A1  Jun. 21, 2018

Related U.S. Application Data

(63) Continuation of application No. PCT/JP2016/067900, filed on Jun. 16, 2016.

(51) Int. Cl.
*H05K 7/20* (2006.01)
*H01L 23/36* (2006.01)
(Continued)

(52) U.S. Cl.
CPC ............. *H01F 27/08* (2013.01); *H01L 23/36* (2013.01); *H01L 23/427* (2013.01); *H02M 1/44* (2013.01);
(Continued)

(58) Field of Classification Search
CPC ..... H01L 23/467; H01L 23/367; H01L 23/36; H01L 23/427; H05K 7/20172; H05K 7/20154; H05K 7/20909; H05K 7/20918; H05K 7/20145; H05K 7/20727; H05K 2201/10106; H05K 7/2039; H05K 1/0203; H05K 7/20163; H05K 2201/066;
(Continued)

(56) References Cited

U.S. PATENT DOCUMENTS 5,428,503 A    6/1995  Matsushima et al.
5,828,549 A *  10/1998  Gandre .................. H01L 23/467
                                                          361/695

(Continued)

FOREIGN PATENT DOCUMENTS

DE    69307753 T2    8/1997
DE    19928567 A1    12/1999
(Continued)

OTHER PUBLICATIONS

English translation by WIPO of the International Preliminary Report on Patentability dated Dec. 18, 2018 in corresponding International Patent Application No. PCT/JP2016/067900.
(Continued)

*Primary Examiner* — Adam B Dravininkas

(57) ABSTRACT

A heat sink 7A is disposed on a circuit board, an air duct is disposed on the heat sink, external cooling air is supplied by the fan attached to the sink air inlet of the heat sink and the air duct inlet of the air duct. Cooling air flowing out of the air duct outlet of the air duct comes into contact with the magnetic component mounted on the circuit board.

7 Claims, 7 Drawing Sheets

(51) Int. Cl.
  *H01L 23/427* (2006.01)
  *F28F 1/02* (2006.01)
  *H01F 27/08* (2006.01)
  *H02M 1/44* (2007.01)

(52) U.S. Cl.
  CPC ..... *H05K 7/20145* (2013.01); *H05K 7/20918* (2013.01); *F28F 1/02* (2013.01)

(58) Field of Classification Search
  CPC ... H05K 7/20136; H01F 27/08; H01F 27/085; H01F 27/2876; H02M 1/44; F28F 1/02
  See application file for complete search history.

(56) References Cited

U.S. PATENT DOCUMENTS

| | | | |
|---|---|---|---|
| 6,154,113 A | | 11/2000 | Murai |
| 7,002,797 B1* | | 2/2006 | Wittig ................ H05K 7/20154 165/80.3 |
| 2002/0179285 A1* | | 12/2002 | Sas ....................... H01L 23/467 165/80.3 |
| 2003/0030980 A1* | | 2/2003 | Bird ...................... H01L 23/467 361/694 |
| 2004/0190251 A1* | | 9/2004 | Prasher ................ H01L 23/473 361/699 |
| 2005/0286226 A1* | | 12/2005 | Ishii ..................... H01L 23/467 361/697 |
| 2007/0223200 A1* | | 9/2007 | Fujiya ................ H05K 7/20727 361/727 |
| 2007/0247811 A1* | | 10/2007 | Ohmi ................ H05K 7/20909 361/697 |
| 2009/0135562 A1* | | 5/2009 | Yang .................... H01L 23/467 361/697 |
| 2010/0195284 A1* | | 8/2010 | Zheng .................. H01L 23/467 361/697 |
| 2012/0160463 A1 | | 6/2012 | Lai |
| 2017/0271240 A1* | | 9/2017 | Inoue .................... H01L 25/18 |

FOREIGN PATENT DOCUMENTS

| | | |
|---|---|---|
| JP | 62-2221 | 1/1987 |
| JP | 2013-93364 | 5/2013 |
| JP | 5661055 | 1/2015 |

OTHER PUBLICATIONS

International Search Report dated Sep. 6, 2016 in corresponding International Patent Application No. PCT/JP2016/067900.
German Office Action dated Oct. 12, 2020 in corresponding German Patent Application No. 112016003428.8.

* cited by examiner

ELECTRONIC APPLIANCE AND POWER CONVERSION APPARATUS

CROSS REFERENCE TO RELATED APPLICATIONS AND INCORPORATION BY REFERENCE

This application is a continuation application filed under 35 U.S.C. § 111(a) of International Patent Application No. PCT/JP2016/067900, filed Jun. 16, 2016, the contents of which are incorporated herein by reference.

TECHNICAL FIELD

The present invention relates to an electronic appliance with a housing containing a device for cooling a magnetic component and a power conversion apparatus including the same.

BACKGROUND ART

As an electronic appliance with a housing containing a device for cooling a heat-emitting electronic component, a device described in PTL 1 is known, for example.

The device described in PTL 1 is provided with a housing containing a fan, a heat sink through which part of the air supplied by the fan flows, and an air passage, which is provided in a space separated from the heat sink and through which air supplied by the fan flows (the air passage is referred to as a first air passage in PTL 1).

In the device described in PTL 1, heat-emitting semiconductor devices fixed on the wall of the heat sink are cooled and a heat-emitting magnetic component, which is a reactor, is cooled by the air flowing in the air passage.

CITATION LIST

Patent Literature

PTL 1: JP 5661055 B2

SUMMARY OF INVENTION

Technical Problem

The device described in PTL 1 uses a plurality of partitions in the housing to form separate spaces for the heat sink and air passages, which is disadvantageous in terms of downsizing and manufacturing cost.

In addition, when the heat sink deprives the semi-conductor devices of heat, the temperature of the air in the air passage adjacent to the heat sink rises and the efficiency in cooling the reactor may decline.

An object of the present invention is to provide an electronic appliance and a power conversion apparatus that increase the efficiency in cooling a magnetic component while allowing downsizing and a reduction of manufacturing cost.

Solution to Problem

In order to achieve the object mentioned above, according to an aspect of the present invention, there is provided an electronic appliance including: a circuit board on which a plurality of electronic components including a heat-emitting electronic component such as a magnetic component are mounted; a tubular heat sink provided with a sink air inlet formed at an end of a sink airflow passage of the heat sink and with a sink air outlet formed at the other end of the sink airflow passage; a tubular air duct made of a material having a heat conductivity smaller than the heat conductivity of the heat sink and provided with an air duct inlet formed at an end of an air duct airflow passage of the air duct and with an air duct outlet at the other end of the air duct airflow passage; a fan; and a housing containing the plurality of electronic components, the circuit board, the heat sink, the air duct, and the fan therein, wherein the heat sink is disposed on the circuit board, wherein the air duct is disposed on the heat sink, wherein external cooling air is supplied by the fan attached to the sink air inlet of the heat sink and to the air duct inlet of the air duct, wherein cooling air flowing out of the air duct outlet of the air duct comes into contact with the magnetic component mounted on the circuit board, and wherein cooling air flowing out of the sink air outlet of the heat sink comes into contact with a first heat-emitting electronic component mounted on a different position of the circuit board from where the magnetic component is mounted.

In addition, according to another aspect of the present invention, there is provided a power conversion apparatus including an electronic appliance described above, wherein the power conversion apparatus converts DC power to AC power.

Advantageous Effects of Invention

According to an electronic appliance and a power conversion apparatus according to the present invention, it is possible to increase the efficiency in cooling a magnetic component while allowing downsizing and a reduction of manufacturing cost.

DESCRIPTION OF EMBODIMENTS

Next, with reference to the accompanying drawings, the first embodiment according to the present invention will be described. In the following description of the drawings, the same or similar reference signs are assigned to the same or similar composing elements. However, it should be noted that the drawings are schematic and relations between thicknesses and planar dimensions, ratios among thicknesses of respective layers, and the like are different from actual ones. Therefore, specific thicknesses and dimensions should be determined in consideration of the following description. It should also be noted that the drawings include portions having different dimensional relationships and ratios from each other.

In addition, the first embodiment, which will be described below, indicate devices and methods to embody the technical idea of the present invention, and the technical idea of the present invention does not limit the materials, shapes, structures, arrangements, and the like of the constituent components to those described below. The technical idea of the present invention can be subjected to a variety of alterations within the technical scope prescribed by the claims.

In the following, a power conversion apparatus equipped with a cooling device according to a first embodiment of the present invention will be described with reference to FIGS. 1 to 8.

Figure 1:
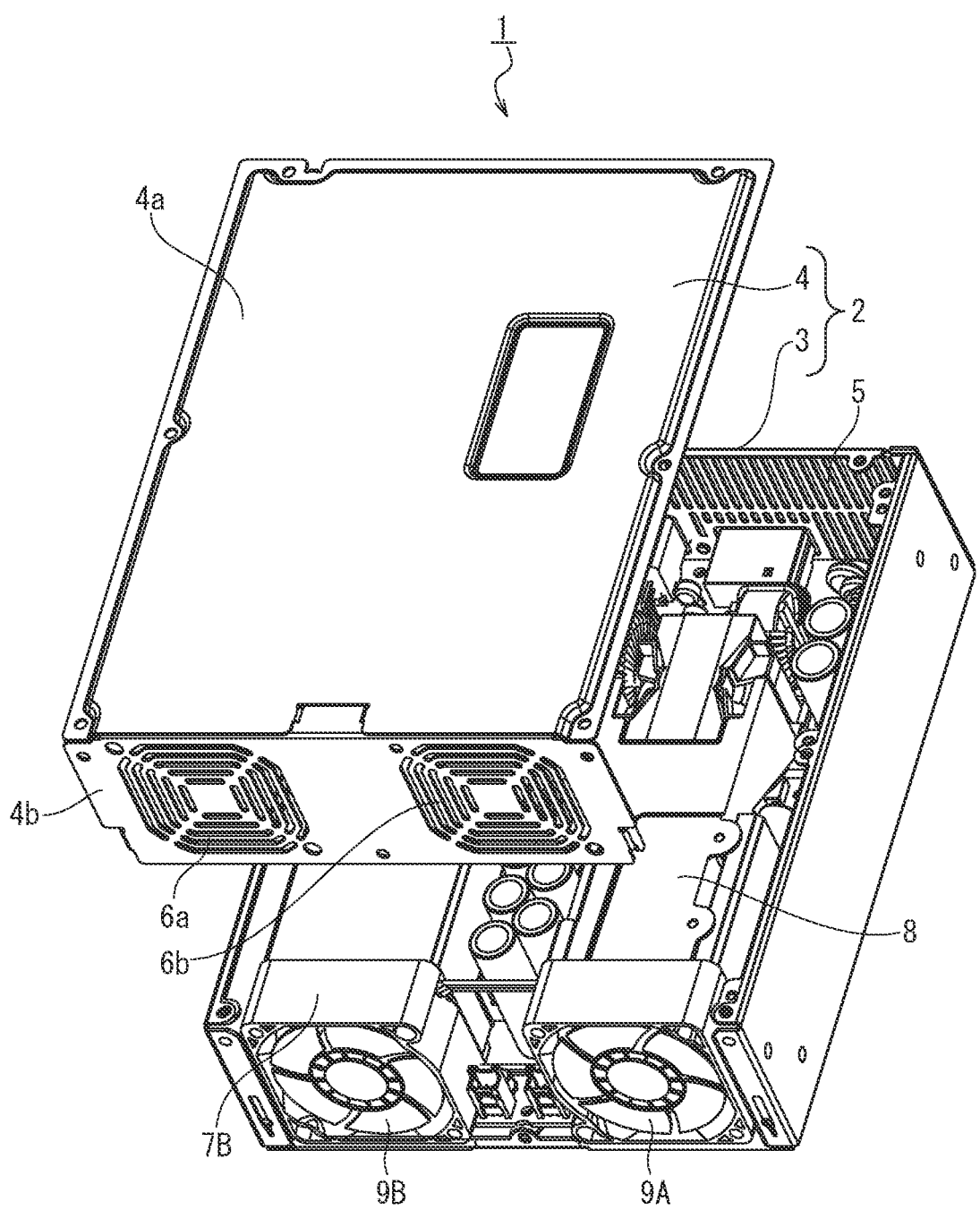
FIG. 1 is a schematic perspective view illustrative of a power conversion apparatus according to a first embodiment of the present invention.

As illustrated in FIG. 1, the power conversion apparatus 1 is an apparatus used as a DC/AC converter and has a rectangular parallelepiped housing 2.

The housing 2 includes a metal case 3 having a box shape with a bottom portion and being rectangular in a plan view and a metal lid 4 formed so as to close the top opening and a side of the case 3.

One of the side walls along the short sides of the case 3 has many ventilation openings 5 formed in the almost entire region of the side wall.

The lid 4 includes a ceiling board 4a and a side board 4b having a rectangular shape and extending perpendicularly from a longitudinal end of the ceiling board 4a. A plurality of ventilation openings 6a, 6b are defined in two regions separated in the longitudinal direction of the side board 4b.

The housing 2 (case 3) contains a power conversion control unit therein and, when a control signal is inputted to the control connector (not illustrated), the DC power inputted to the input connector (not illustrated) is converted from DC to AC by the power conversion control unit and outputted from the output connector (not illustrated) as AC power.

Figure 2:
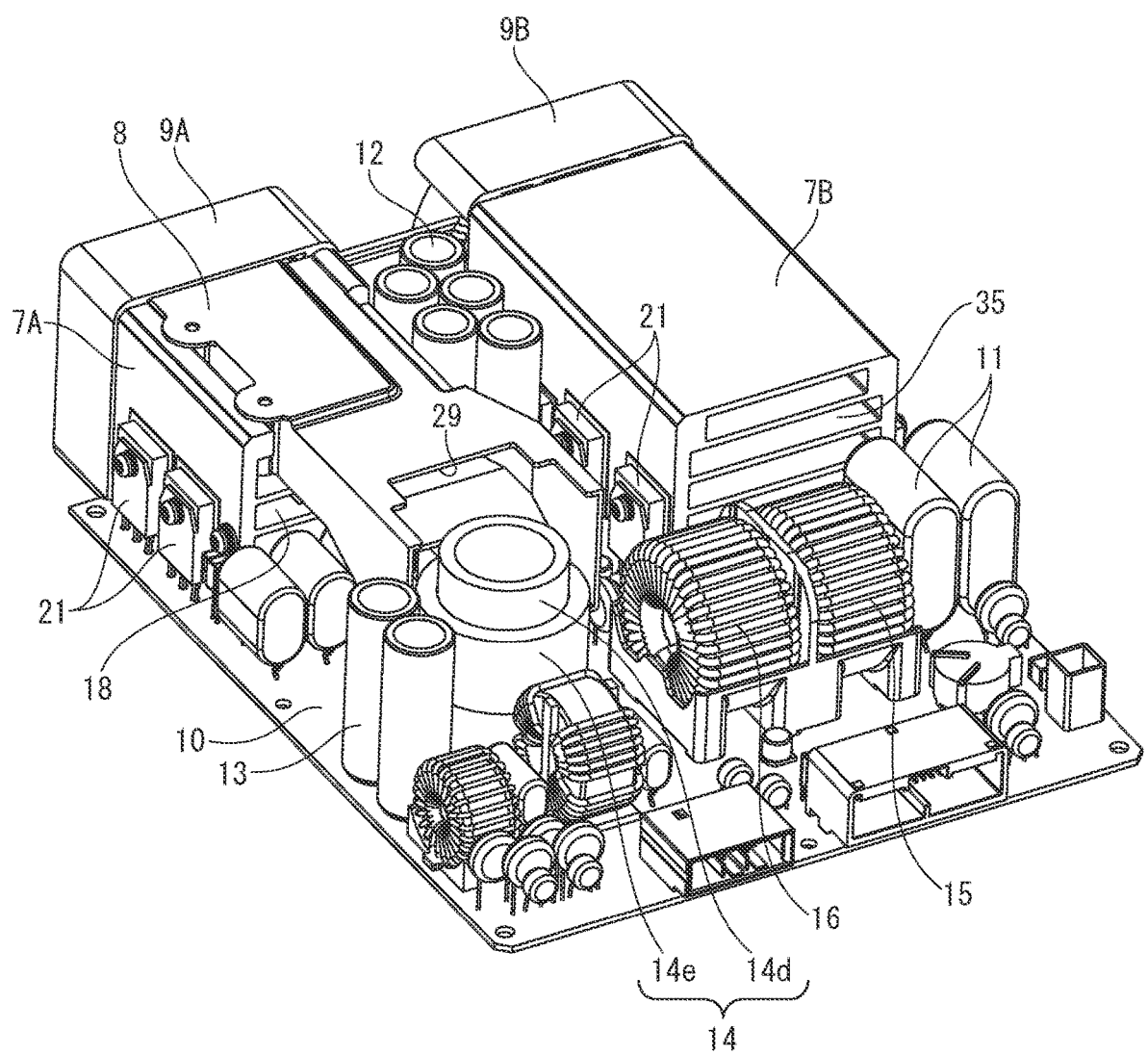
FIG. 2 is a perspective view illustrative of the power conversion apparatus according to the first embodiment, in which the housing is removed and the magnetic component is depicted only as the inner coil and the outer coil thereof at the air duct outlet of the air duct.

As illustrated in FIGS. 1 and 2, the housing 2 contains the power conversion control unit, two heat sinks 7A, 7B, an air duct 8, and two fans 9A, 9B therein.

Figure 3:
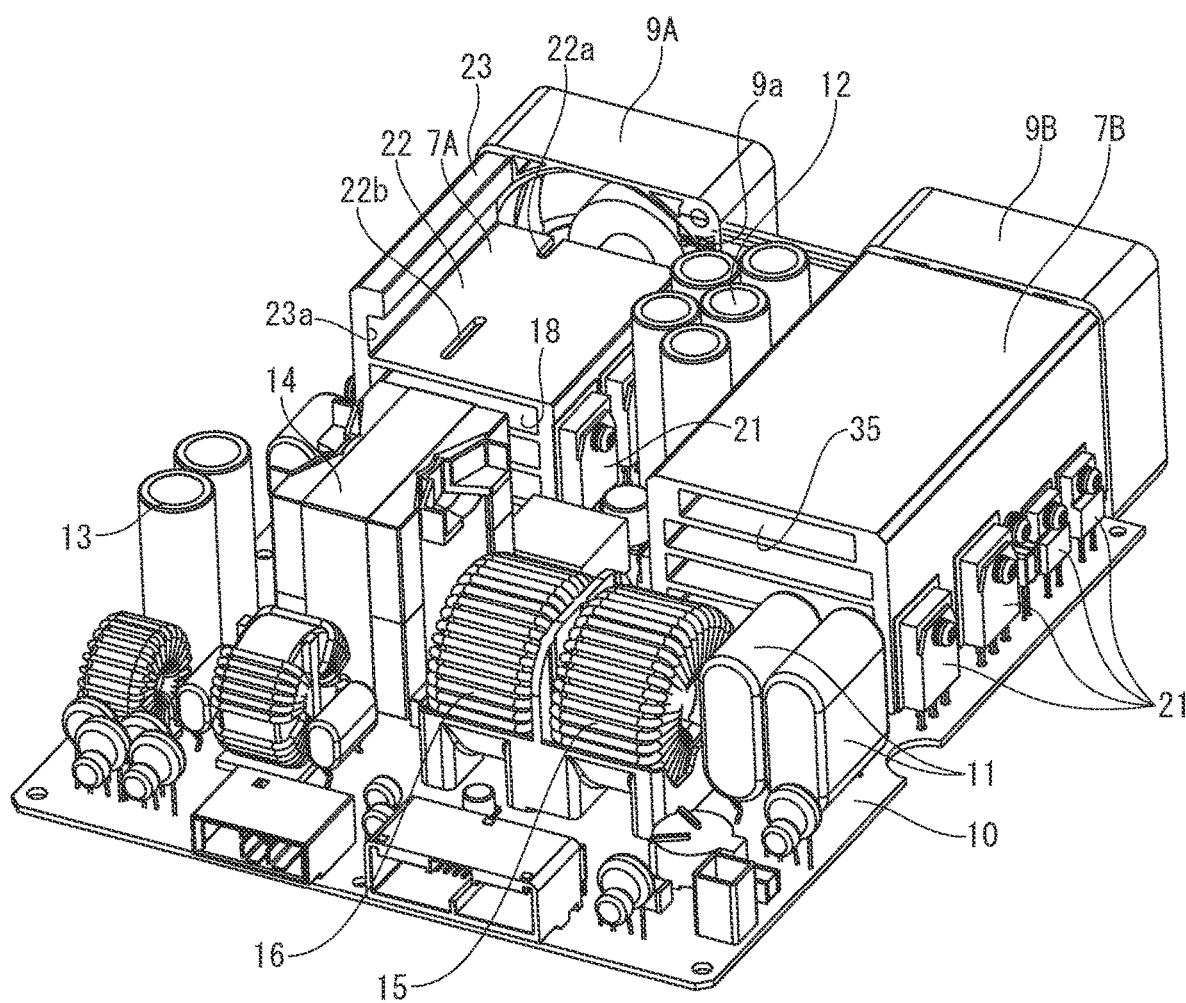
FIG. 3 is a perspective view illustrative of the structure in which the air duct included in the power conversion apparatus according to the first embodiment is removed from above a heat sink.

As illustrated in FIGS. 2 and 3, the power conversion control unit includes a circuit board 10, reactors 11, first electrolytic capacitors 12, second electrolytic capacitors 13, a transformer 14, choking coils 15, 16, and a plurality of control components such as semi-conductor devices (for example, MOS-FET) 21. In FIG. 2, only a primary coil 14d and a secondary coil 14e are illustrated among the parts included in the transformer 14.

The circuit board 10 is formed in a rectangular shape smaller than the planar shape of the bottom portion of the case 3 and fixed by bolt to a support platform (not illustrated) formed on the upper surface of the bottom portion of the case 3.

The circuit board 10 has the reactors 11, the first electrolytic capacitors 12, the second electrolytic capacitors 13, the transformer 14, the choking coils 15, 16, the plurality of semi-conductor devices 21, and other electronic components described above mounted thereon and the heat sinks 7A, 7B fixed thereto.

Figure 4:
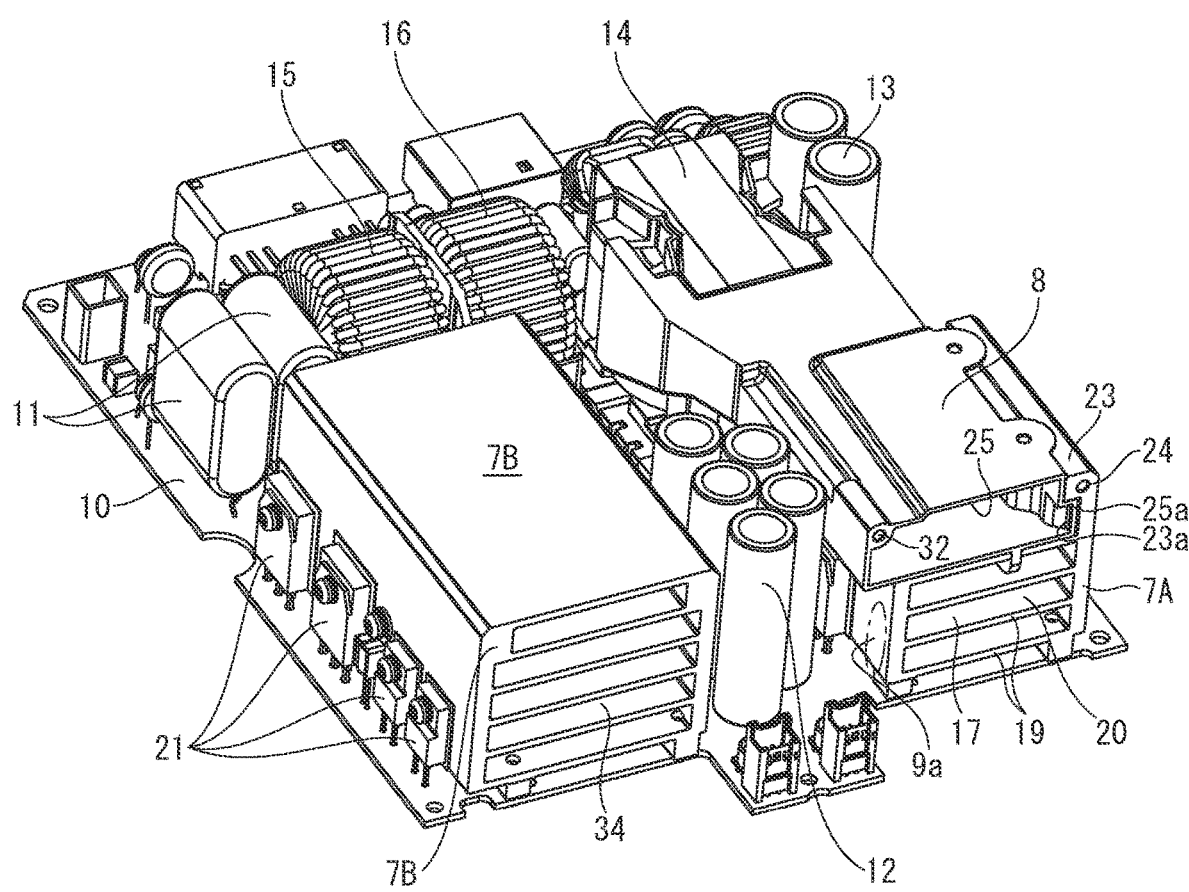
FIG. 4 is a perspective view illustrative of the structure in which the fans included in the power conversion apparatus according to the first embodiment are removed from heat sinks and the air duct.

A first heat sink 7A is a member with a high heat conductivity and formed, for example, by extruding aluminum or aluminum alloy and, as illustrated in FIGS. 2 and 4, both ends of the first heat sink 7A in the longitudinal direction are machined to form a sink air inlet 17 at an end in the longitudinal direction (see FIG. 4) and a sink air outlet 18 at the other end in the longitudinal direction (see FIG. 2).

Between the sink air inlet 17 and the sink air outlet 18 of the first heat sink 7A, a plurality of airflow passages 20 separated by a plurality of fins 19 are formed parallel to each other, as illustrated in FIG. 4.

As illustrated in FIG. 3, on the top portion of the first heat sink 7A, a flat and rectangular mounting surface 22 on which to mount an air duct 8 is formed and, in parts of the mounting surface 22, holding slits 22a, 22b are defined to hold air duct 8.

As illustrated in FIGS. 3 and 4, a sink side wall 23 extends upwards from a long side of the mounting surface 22 and the sink side wall 23 defines a fitting recess 23a along the inner wall of the sink side wall 23 with an upper portion of the sink side wall 23 bent over the mounting surface 22.

As illustrated in FIG. 4, a screw opening 24 is formed on the end face of the sink side wall 23 on the side where the sink air inlet 17 is disposed.

The air outlet of the first fan 9A is designed to be larger than the sink air inlet 17 of the first heat sink 7A and part of the air outlet of the first fan 9A is exposed at the region indicated by numeral 9a in FIG. 3 (the site indicated by numeral 9a in FIG. 4).

Figure 5:
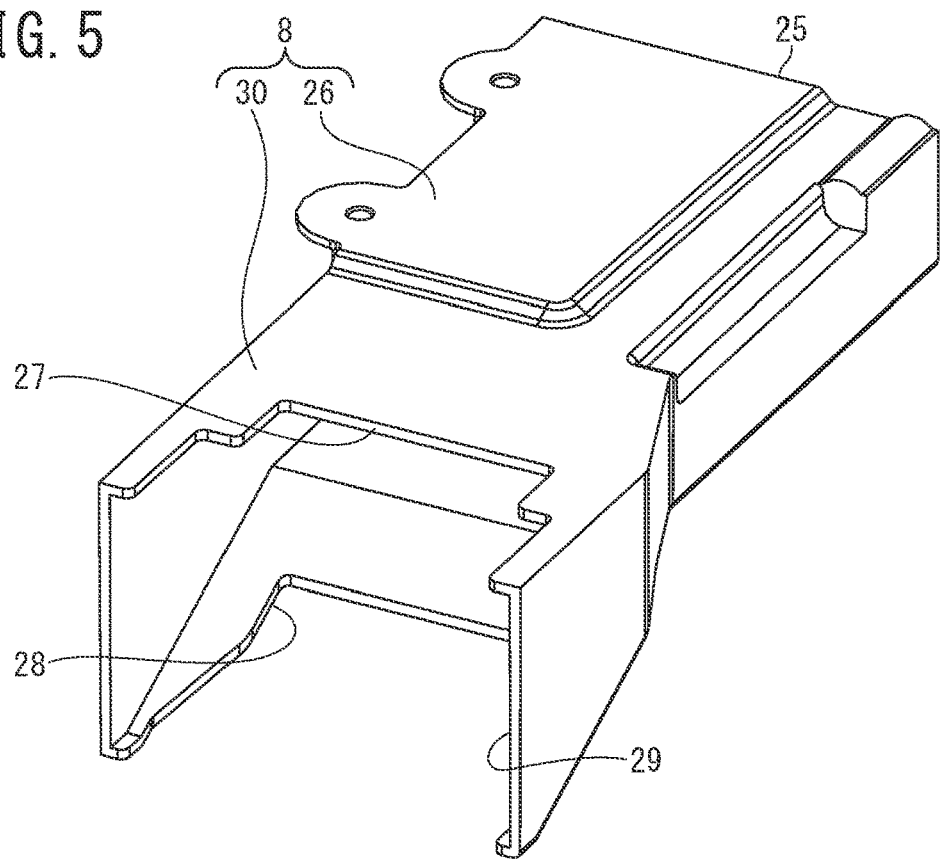
FIG. 5 is a perspective view illustrative of the air duct included in the power conversion apparatus according to the first embodiment.
Figure 6:
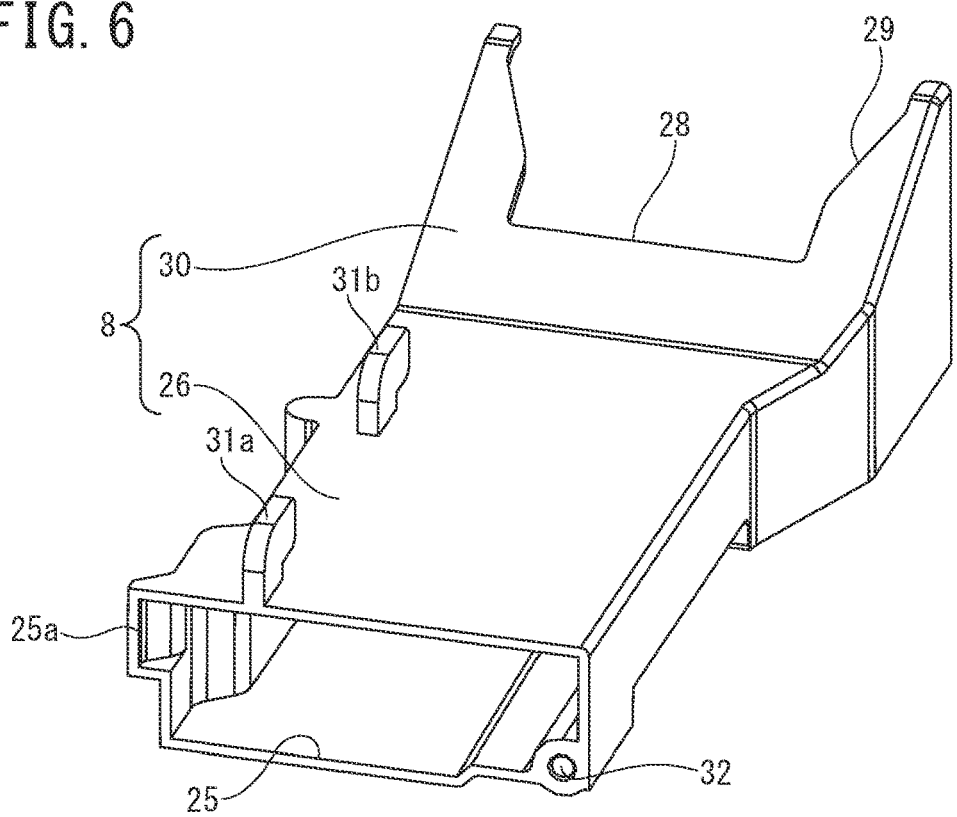
FIG. 6 is a perspective view illustrative of the back side of the air duct included in the power conversion apparatus according to the first embodiment.

With reference to FIGS. 5 and 6, the air duct 8 is made of a material having a smaller heat conductivity than that of the first heat sink 7A, such as synthetic resin. The air duct 8 includes a first tubular part 26 having a quadrilateral shape, configured to be mounted on the mounting surface 22 of the heat sink 7, an air duct inlet 25 being open at an end of the first tubular part 26, and a second tubular part 30 having an outwardly expanded tubular form continuously extending from the first tubular part 26 and provided with an air duct outlet 29, cut-down parts 27, 28 being defined at the edges of confronting sides of the open end of the air duct outlet 29.

As illustrated in FIG. 6, the first tubular part 26 is provided with holding protrusions 31a, 31b formed on the surface configured to abut the mounting surface 22 of the first heat sink 7A and with a fitting protrusion 25a formed on a portion of the air duct inlet 25 in the first tubular part 26 to fit into the fitting recess 23a of the sink side wall 23.

A screw opening 32 is formed on the end face of the air duct inlet 25.

As illustrated in FIG. 4, the first tubular part 26 of the air duct 8 is mounted on the mounting surface 22 of the first heat sink 7A. In so doing, the holding protrusions 31a, 31b of the air duct 8 are inserted to the holding slits 22a, 22b of the mounting surface 22 and the fitting protrusion 25a is fitted into the fitting recess 23a of the sink side wall 23. This ensures the first tubular part 26 of the air duct 8 to be held on the mounting surface 22 of the first heat sink 7A and the air duct inlet 25 to be open above the sink air inlet 17.

By turning a fixing screw (not illustrated) for the first fan 9A into the screw opening 32 of the air duct 8 and the screw opening 24 of the sink side wall 23 while holding the first tubular part 26 of the air duct 8 on the mounting surface 22 of the first heat sink 7A as described above, the air duct 8 and the first fan 9A are secured onto the first heat sink 7A.

As illustrated in FIG. 4, the air duct outlet 29 of the air duct 8 is disposed above the sink air outlet 18 of the first heat sink 7A and a transformer 14 mounted on the circuit board 10 is disposed in front of the air duct outlet 29. (In FIG. 2, only a primary coil 14d and a secondary coil 14e are illustrated among the parts included in the transformer 14.)

Figure 7:
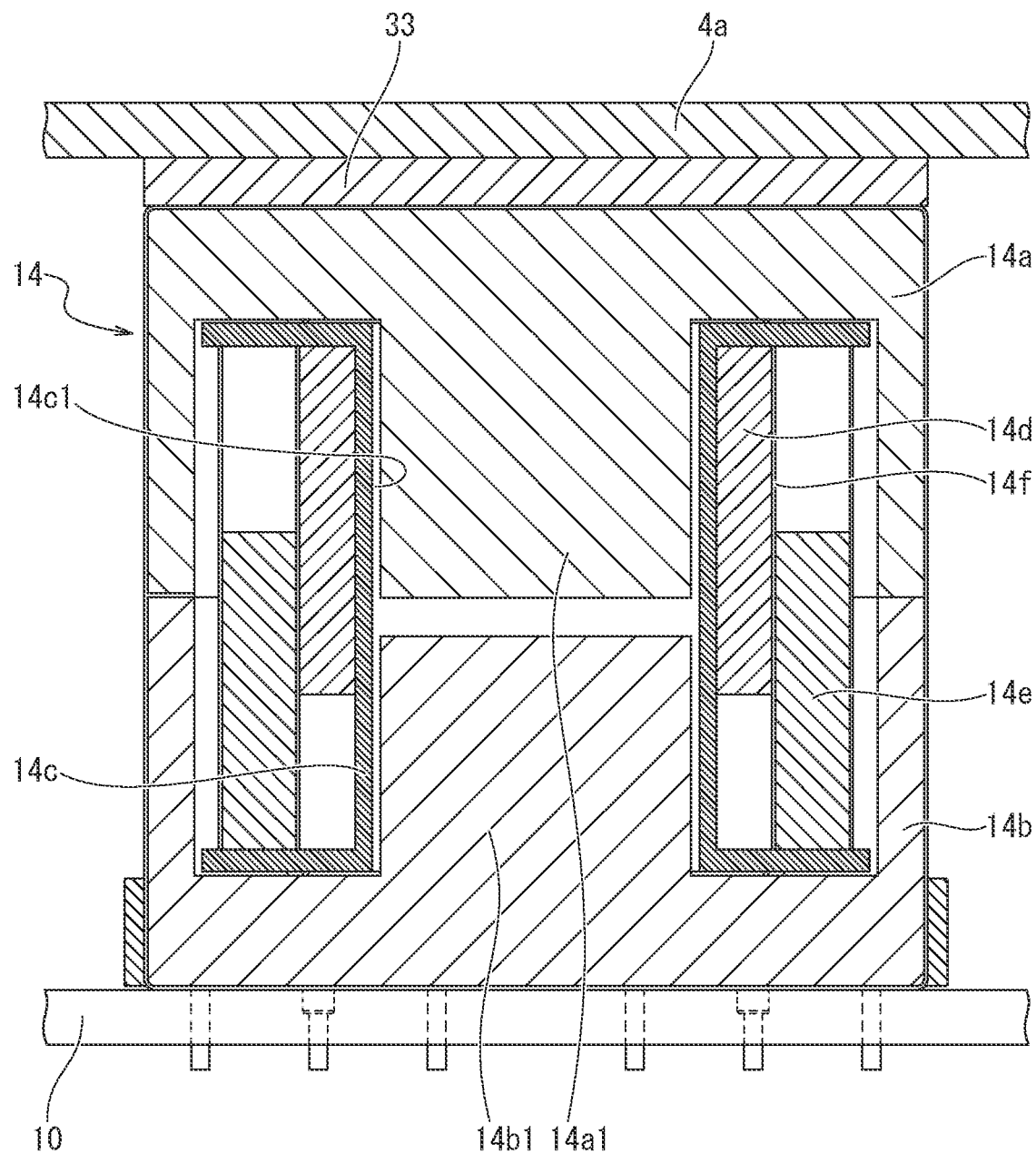
FIG. 7 is a view illustrative of the structure of a magnetic component (transformer) included in the power conversion apparatus according to the first embodiment.

As illustrated in FIG. 7, the transformer 14 includes an upper core 14a, a lower core 14b, a tubular bobbin 14c, a primary coil 14d, and a secondary coil 14e.

The primary coil 14d is wound around the outer circumference of the bobbin 14c. The secondary coil 14e is wound around the outer circumference of the primary coil 14d after an insulating tape 14f is wound around the outer circumference of the primary coil 14d. A protrusion 14a1 provided on the upper core 14a and a protrusion 14b1 provided on the lower core 14b are fitted into a fitting hole 14c1 defined along the axis of the bobbin 14c to form the transformer 14.

The primary coil 14d, wound around the bobbin 14c in an inner position relative to the secondary coil 14e, is wound around an upper portion of the bobbin 14c so that cold air supplied from the air duct outlet 29 directly comes into contact with the primary coil 14d.

As illustrated in FIG. 7, the transformer 14 is provided with a heat transfer sheet 33 disposed all over the top surface thereof and the heat transfer sheet 33 abuts the ceiling board 4a of the lid 4 in surface-to-surface contact when the lid 4 closes the opening of the case 3 of the housing 2.

The second heat sink 7B has a similar structure to the first heat sink 7A, the second fan 9B being fixed to a sink air inlet 34 formed at an end in the longitudinal direction of the second heat sink 7B.

The electronic components mounted on the circuit board 10, for example, the plurality of semi-conductor devices 21, are mounted on the circuit board 10 in such a manner as to contact side walls of the first heat sink 7A and the second heat sink 7B.

The reactors 11 and the choking coils 15, 16 are mounted on the circuit board 10 in areas close to the sink air outlet 35 of the second heat sink 7B.

The second electrolytic capacitors 13 are mounted on the circuit board 10 in an area in front of the sink air outlet 18 of the first heat sink 7A.

The first electrolytic capacitors 12 are mounted on the circuit board 10 in an area close to the region 9a where part of air outlet of the first fan 9A is exposed.

The heat sink according to the present invention corresponds to the first heat sink 7A, the sink airflow passage according to the present invention corresponds to the airflow passage 20, the fan according to the present invention corresponds to the first fan 9A, the magnetic component according to the present invention corresponds to the transformer 14, the inner coil according to the present invention corresponds to the primary coil 14d, the first heat-emitting electronic component according to the present invention corresponds to the second electrolytic capacitors 13, the second heat-emitting electronic component according to the present invention corresponds to the first electrolytic capacitors 12, the air duct holding part according to the present invention corresponds to the holding protrusions 31a, 31b of the air duct 8 to be inserted to the holding slits 22a, 22b of the mounting surface 22, and the fitting protrusion 25a to be fitted into the fitting recess 23a of the sink side wall 23.

Figure 8:
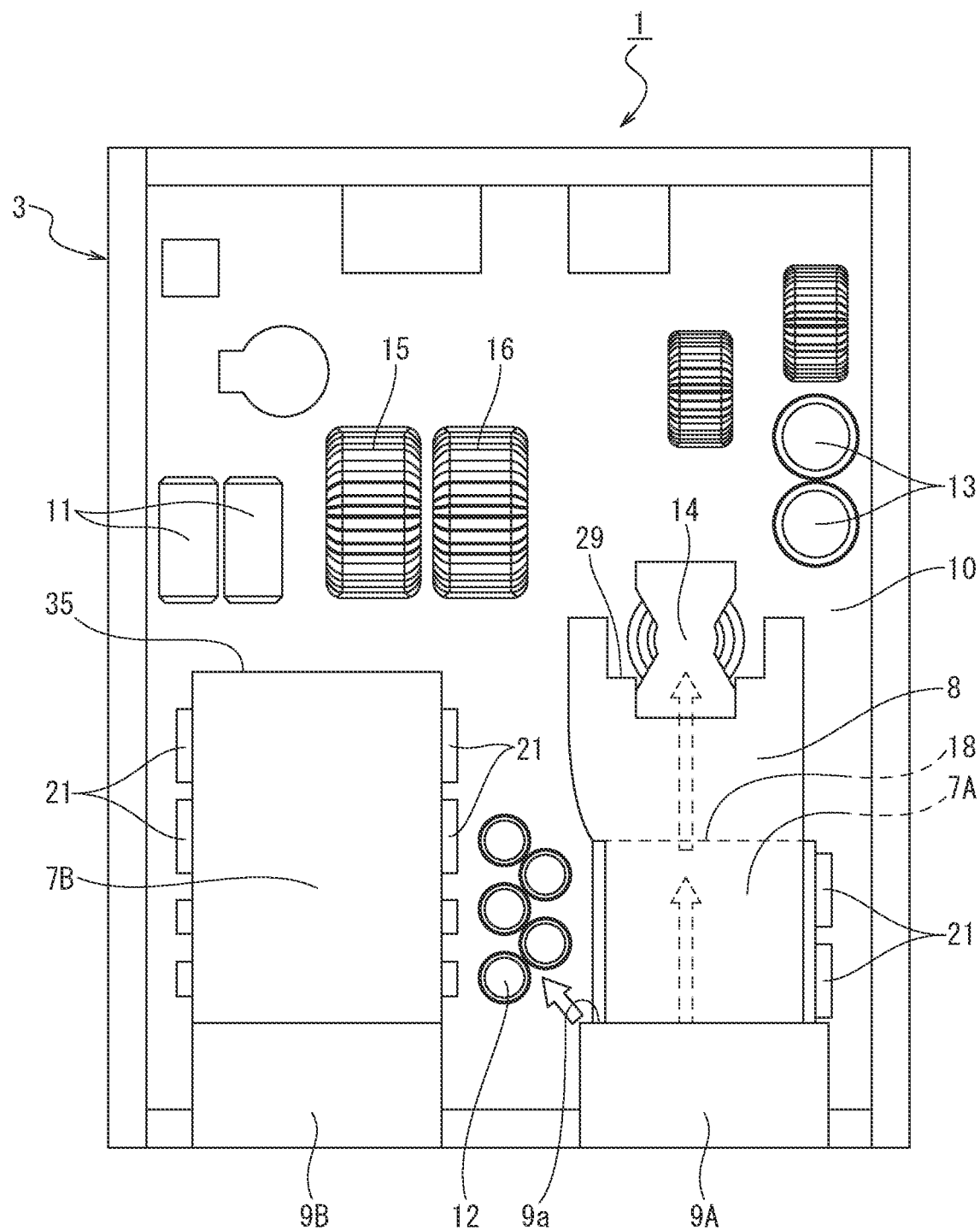
FIG. 8 is a view illustrative of an arrangement of the circuit board with electronic components mounted thereon, heat sinks, an air duct, and fans contained in the housing of the power conversion apparatus according to the first embodiment.

An operation of the power conversion apparatus 1 according to the first embodiment will be described next with reference to FIG. 8.

In the power conversion apparatus 1 according to the present embodiment, when a control signal is inputted to the control connector, the DC power inputted to the input connector is converted to AC power by the power conversion control unit and outputted from the output connector as AC power.

During this process, control components in the case 3, such as the power conversion control unit, emit heat and, in particular, the plurality of semi-conductor devices 21, the transformer 14, and the choking coils 15, 16 have a high self-heat generation.

In the power conversion apparatus 1, when the two fans 9A, 9B operate, cooling air is taken from the outside through the ventilation openings 6a, 6b of housing 2 into the sink air inlets 17, 34 of the two heat sinks 7A, 7B and flows out from the sink air outlets 18, 35.

As cooling air flows through inside the heat sinks 7A, 7B, the temperatures of the heat sinks 7A, 7B are lowered, cooling the semi-conductor devices 21, which are mounted on the circuit board 10 in such a manner as to contact side walls of the heat sinks 7A, 7B.

As cooling air flows out of the sink air outlet 18 of the first heat sink 7A, cooling air comes into contact with the second electrolytic capacitors 13 mounted on the circuit board 10 in an area in front of the sink air outlet 18.

As cooling air flows out of the sink air outlet 35 of the second heat sink 7B, cooling air comes into contact with the reactors 11 and the choking coils 15, 16, which are mounted on the circuit board 10 in an area close to the sink air outlet 35.

The air outlet of the first fan 9A is designed to be larger than the sink air inlet 17 of the first heat sink 7A and cooling air is directly applied to the first electrolytic capacitors 12 from the region 9a where part of the air outlet of the first fan 9A is exposed.

Cooling air flows onto the transformer 14 through the air duct 8 with the air duct inlet 25 connected with the first fan 9A.

The primary coil 14d of the transformer 14, disposed in an inner position relative to the secondary coil 14e, has a high self-heat generation but the cooling air flowing from the air duct outlet 29 of the air duct 8 is directly applied to the primary coil 14d and the primary coil 14d cools down. The heat transfer sheet 33 disposed on the top surface of the transformer 14 abuts the ceiling board 4a of the lid 4 of the housing 2 in surface-to-surface contact and the heat emitted by the transformer 14 dissipates to the housing 2 via the heat transfer sheet 33.

Advantageous effects of the power conversion apparatus 1 according to the first embodiment will be described next.

As cooling air supplied by the first fan 9A flows out of the air duct outlet 29 of the air duct 8, which is made of a material having a heat conductivity smaller than that of the first heat sink 7A, and directly comes into contact with the transformer 14, the transformer 14 is efficiently cooled without being affected by the heat from the first heat sink 7A.

As the primary coil 14d of the transformer 14 is disposed close to the air duct outlet 29 of the air duct 8, cooling air directly comes into contact with the primary coil 14d, which increases the efficiency in cooling the transformer 14.

Further, as the top surface of the transformer 14 is in contact with the lid 4 (ceiling board 4a) of the housing 2 via the heat transfer sheet 33, heat emitted by the transformer 14 is dissipated to the housing 2 via the heat transfer sheet 33, further increasing the efficiency in cooling the transformer 14.

As the air outlet of the first fan 9A is designed to be larger than the sink air inlet 17 of the first heat sink 7A, the first electrolytic capacitors 12 are efficiently cooled by cooling air supplied from the region 9a where part of the air outlet of the first fan 9A is exposed.

Further, first tubular part 26 of the air duct 8 is easily fixed on the mounting surface 22 of the first heat sink 7A by placing the first tubular part 26 of the air duct 8 on the mounting surface 22 of the first heat sink 7A, inserting the holding protrusions 31a, 31b of the air duct 8 into the holding slits 22a, 22b of the mounting surface 22 and fitting the fitting protrusion 25a into the fitting recess 23a of the sink side wall 23. As the air duct 8 and the first fan 9A are secured to the first heat sink 7A by simply turning a fixing screw for the first fan 9A into the screw opening 32 of the air duct 8 and the screw opening 24 of the sink side wall 23, the power conversion apparatus 1 can be assembled easily while maintaining the attachment strength and reducing the number of attached components in attaching the air duct 8 to the heat sink 7.

In addition, as the first fan 9A is supported by the first heat sink 7A alone, the number of attached components can be further reduced for easy assembly.

REFERENCE SIGNS LIST 1 power conversion apparatus
2 housing
3 case
4 lid
4a ceiling board
4b, 4c side board
5 ventilation opening
6a, 6b ventilation opening
7A, 7B heat sink
8 air duct
9A, 9B fan
9a part of the air outlet of the fan
10 circuit board
11 reactor
12 first electrolytic capacitor
13 second electrolytic capacitor
14 transformer
14a upper core
14b lower core
14c bobbin
14d primary coil
14e secondary coil
14f insulating tape
14a1 protrusion
14b1 protrusion
14c1 fitting hole
15, 16 choking coil
17 sink air inlet
18 sink air outlet
19 fin
20 airflow passage
21 semi-conductor device
22 mounting surface
22a, 22b holding slit
23 sink side wall
23a fitting recess
24 screw opening
25 air duct inlet
26 first tubular part
27, 28 cut-down part
29 air duct outlet
30 second tubular part
31 engaging projection
32 screw opening
33 heat transfer sheet

The invention claimed is:

1. An electronic appliance comprising:
a circuit board on which a plurality of electronic components including a heat-emitting electronic component are mounted;
a tubular heat sink provided with a sink air inlet formed at an end of a sink airflow passage of the heat sink and with a sink air outlet formed at the other end of the sink airflow passage;
a tubular air duct made of a material having a heat conductivity smaller than a heat conductivity of the heat sink and provided with an air duct inlet formed at an end of an air duct airflow passage of the air duct and with an air duct outlet at the other end of the air duct airflow passage;
a fan; and
a housing containing the plurality of electronic components, the circuit board, the heat sink, the air duct, and the fan therein,
wherein the heat sink is disposed on the circuit board,
wherein the air duct is disposed on the heat sink,
wherein external cooling air is supplied by the fan attached to the sink air inlet of the heat sink and to the air duct inlet of the air duct,
wherein cooling air flowing out of the air duct outlet of the air duct comes into contact with the heat-emitting electronic component mounted on the circuit board, and
wherein cooling air flowing out of the sink air outlet of the heat sink comes into contact with a first heat-emitting electronic component mounted on a different position of the circuit board from where the heat-emitting electronic component is mounted.

2. The electronic appliance according to claim 1,
wherein the heat-emitting electronic component is a magnetic component which comprises a tubular bobbin, a primary coil and a secondary coil that are wound around the bobbin, and cores holding the bobbin from both ends in an axial direction of the bobbin,
wherein one of the primary coil and the secondary coil is an inner coil wound around the bobbin and the other of the primary coil and the secondary coil is an outer coil wound around the inner coil, and
wherein the inner coil is wound around an upper portion of the bobbin and is close to the air duct outlet.

3. The electronic appliance according to claim 2, wherein a heat transfer sheet is disposed between a top surface of one of the cores of the magnetic component and a lid of the housing, the lid abutting the top surface.

4. The electronic appliance according to claim 1,
wherein the fan is provided with a fan outlet designed to be larger than the sink air inlet of the heat sink, and
wherein cooling air supplied from part of the fan outlet not covered by the sink air inlet comes into contact with a second heat-emitting electronic component mounted on the circuit board in an area close to the sink air inlet of the heat sink.

5. The electronic appliance according to claim 1,
wherein the air duct is held in position on the heat sink by an air duct holding part, and
wherein the fan is fixed to the sink air inlet of the heat sink and the air duct inlet of the air duct with a fixing screw.

6. The electronic appliance according to claim 5, wherein the fan is fixed to the heat sink via the sink air inlet, allowing the heat sink to support the fan by itself.

7. A power conversion apparatus comprising an electronic appliance according to claim 1, wherein the power conversion apparatus converts DC power to AC power.

\* \* \* \* \*